US010931826B1

(12) United States Patent
Stepanov et al.

(10) Patent No.: US 10,931,826 B1
(45) Date of Patent: *Feb. 23, 2021

(54) SCHEDULING AGENTS USING SKILL GROUP WEIGHTS

(71) Applicant: Talkdesk, Inc., San Francisco, CA (US)

(72) Inventors: Gennadiy Stepanov, Hallandale Beach, FL (US); Jason Fama, San Carlos, CA (US); Richard Lawrence, San Diego, CA (US)

(73) Assignee: TALKDESK, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/668,895

(22) Filed: Oct. 30, 2019

Related U.S. Application Data

(63) Continuation of application No. 16/668,525, filed on Oct. 30, 2019.

(51) Int. Cl.
*H04M 3/51* (2006.01)
*H04M 3/523* (2006.01)
*G06F 30/20* (2020.01)

(52) U.S. Cl.
CPC .......... *H04M 3/5233* (2013.01); *G06F 30/20* (2020.01); *H04M 3/5175* (2013.01)

(58) Field of Classification Search
None
See application file for complete search history.

(56) References Cited

U.S. PATENT DOCUMENTS

| | | | | |
|---|---|---|---|---|
| 6,970,829 B1 * | 11/2005 | Leamon | ........... | G06Q 10/06 705/7.14 |
| 8,577,706 B1 * | 11/2013 | Aykin | ........... | G06Q 10/063 705/7.11 |
| 8,612,272 B1 * | 12/2013 | Aykin | ........... | G06Q 10/063 705/7.11 |
| 2002/0143597 A1 * | 10/2002 | Andre | ........... | G06Q 10/06375 705/7.14 |
| 2008/0004933 A1 * | 1/2008 | Gillespie | ........... | G06Q 10/06311 705/7.14 |
| 2015/0350442 A1 * | 12/2015 | O'Connor | ........... | H04M 3/5232 379/265.11 |

* cited by examiner

*Primary Examiner* — Harry S Hong
(74) *Attorney, Agent, or Firm* — Rimon PC; Marc Kaufman

(57) ABSTRACT

Agents are grouped into skill groups based on the skills of each agent. Simulation are performed for a contact center with multiple queues, where agents from the skill groups are assigned to the queues based on the skills of the skill groups and the skills of the queues. After running the simulations, for each skill group and for each interval, the time each agent spent working using each associated skill is determined, and an average time for each skill is calculated for each interval. The average times are used to create a skill group weight for the skill group for each interval. Later, when the schedule engine is determining an agent placement for one or more intervals, the skill group weights for the intervals are used to calculate a score for the queues based on different agent placements. The placement with the best score (e.g., lowest) is implemented.

20 Claims, 5 Drawing Sheets

SCHEDULING AGENTS USING SKILL GROUP WEIGHTS

This application is a continuation of U.S. patent application Ser. No. 16/668,525 filed on Oct. 30, 2019, entitled "SCHEDULING AGENTS USING SKILL GROUP WEIGHTS." The contents of which are hereby incorporated by reference.

BACKGROUND

Assigning workers to shifts and tasks is an important part of many businesses. For a business such as a contact center, workers (e.g., agents) are assigned to tasks (e.g., queues) based on skills associated with each agent and the skills required to work each queue.

As may be appreciated, when an agent has the requisite skills to work multiple queues, the call center may have difficulty determining which scheduling assignment is optimal because there is no easy way to see how the agent is contributing across all of their queues. One solution is simulating the work on all of the queues with different agent assignments, but a simulation takes seconds or even minutes to run, so it cannot be used in conjunction with an automated scheduling engine that evaluates thousands of schedule assignments.

SUMMARY

Agents are grouped into skill groups based on the skills associated with each agent. A simulation is performed for a contact center with multiple queues, where agents from the skill groups are assigned to the queues based on the skills associated with the skill groups and the skills required by the queues. The simulation may be performed multiple times over multiple intervals. After the simulations are complete, for each skill group and for each interval, the amount of time that each agent spent working using each skill associated with the skill group is determined for each interval, and an average time for each skill is calculated across all of the agents for each interval. The average times for each skill associated with the skill group is used to create a skill group weight for the skill group for each interval. Later, when the scheduling engine is determining which queue to place an agent in for one or more intervals, the skill group weights for the intervals are used to calculate a score for some or all of the queues based on different placements of the agent. The placement that results in the best score (e.g., lowest) may be implemented by the contact center. Because the simulations that are used to generate the skill group weights ahead of time (i.e., before the agents are placed), the agents can be quickly and efficiently placed in queues without having to simulate the queues each time a placement is needed.

In an embodiment, a method is provided. The method includes: receiving information about a plurality of agents, wherein each agent of the plurality of agents is associated with one or more skills of a plurality of skills; dividing the agents of the plurality of agents into one or more skill groups based on the one or more skills associated with each agent of the plurality of agents, wherein each skill group is associated with one or more skills; and for each skill group, calculating a skill group weight for the skill group for an interval, wherein the skill group weight for a skill group comprises a weight for each skill associated with the skill group, wherein the sum of the skill group weights for the skill group for the interval is one.

In an embodiment, a method is provided. The method includes: receiving information about a plurality of skill groups, wherein each skill group is associated with one or more skills of a plurality of skills, wherein each skill group is associated with one or more agents of a plurality of agents, and further wherein the one or more agents associated with a skill group are associated with the same one or more skills as the skill group; for each skill group of the plurality of skill groups, receiving a skill group weight for an interval, wherein the skill group weight comprises a weight for each skill associated with the skill group during the interval; receiving a request to schedule the plurality of agents on one or more queues for the interval, wherein each queue is associated with one or more skills of the plurality of skills, and further wherein the request to schedule is received after the skill group weights are received; receiving a required staffing for each queue; and assigning agents of the plurality of agents to each queue for the interval based on the required staffing for each queue and the skill group weight calculated for the skill group associated with each agent of the plurality of agents.

In an embodiment, a method is provided. The method includes: receiving information about a plurality of skill groups, wherein each skill group is associated with skills of a plurality of skills, wherein each skill group is associated with one or more agents of a plurality of agents, and further wherein the one or more agents associated with a skill group are associated with the same skills as the skill group; and for each skill group of the plurality of skill groups, calculating a skill group weight for the skill group for an interval, wherein the skill group weight for a skill group comprises a weight for each skill associated with the skill group, by: simulating a contact center for the interval using the agents associated with the skill group; for each agent associated with the skill group: for each skill associated with the skill group: determining an amount of time that the agent spent working on the skill during the simulation for the interval while disregarding time the agent spend idle; for each skill associated with the skill group, determining an average amount of time that each agent associated with the skill group spent working on the skill for the interval; and for each weight of the skill group weight, determining the weight based on the determined average amount of time that each agent associated with the skill group spent working on the skill for the interval, wherein a sum of the weights of the skill group is one.

In an embodiment, a method is provided. The method includes: receiving information about a plurality of skill groups, wherein each skill group is associated with one or more skills of a plurality of skills, wherein each skill group is associated with one or more agents of a plurality of agents, and further wherein the one or more agents associated with a skill group are associated with the same one or more skills as the skill group; dividing the plurality of skill groups into a first network and a second network based on the skills associate with each skill group, wherein no skill group in the first network is associated with a same skill as a skill group in the second network; for each skill group of the first network, calculating a skill group weight for the skill group of the first network for an interval, wherein the skill group weight for a skill group comprises a weight for each skill associated with the skill group; and for each skill group of the second network, calculating a skill group weight for the skill group of the second network for the interval.

In an embodiment, a method is provided. The method includes: receiving information about a plurality of agents, wherein each agent is associated with one or more skills of a plurality of skills, wherein each agent is associated with a skill group of a plurality of skill groups, and further wherein each skill group is associated with a skill group weight for an interval; receiving a required staffing for each queue of a plurality of queues for the interval, wherein each queue is associated with one or more skills of the plurality of skills; and assigning agents of the plurality of agents to each queue for the interval based on the required staffing for each queue and the skill group weight associated with the skill group associated with each agent of the plurality of agents by: for each iteration of a plurality of iterations: generating an agent assignment for the iteration by: for each queue of the plurality of queues: assigning agents of the plurality of agents to the queue based on the one or more skills associated with the queue, the one or more skills associated with the agents, and the required staffing for the queue; and calculating a score for the agent assignment based on the required staffing for each queue and the skill group weights of the skill groups associated with the agents assigned to each queue.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. While implementations will be described within a cloud-based contact center, it will become evident to those skilled in the art that the implementations are not limited thereto.

Figure 1:
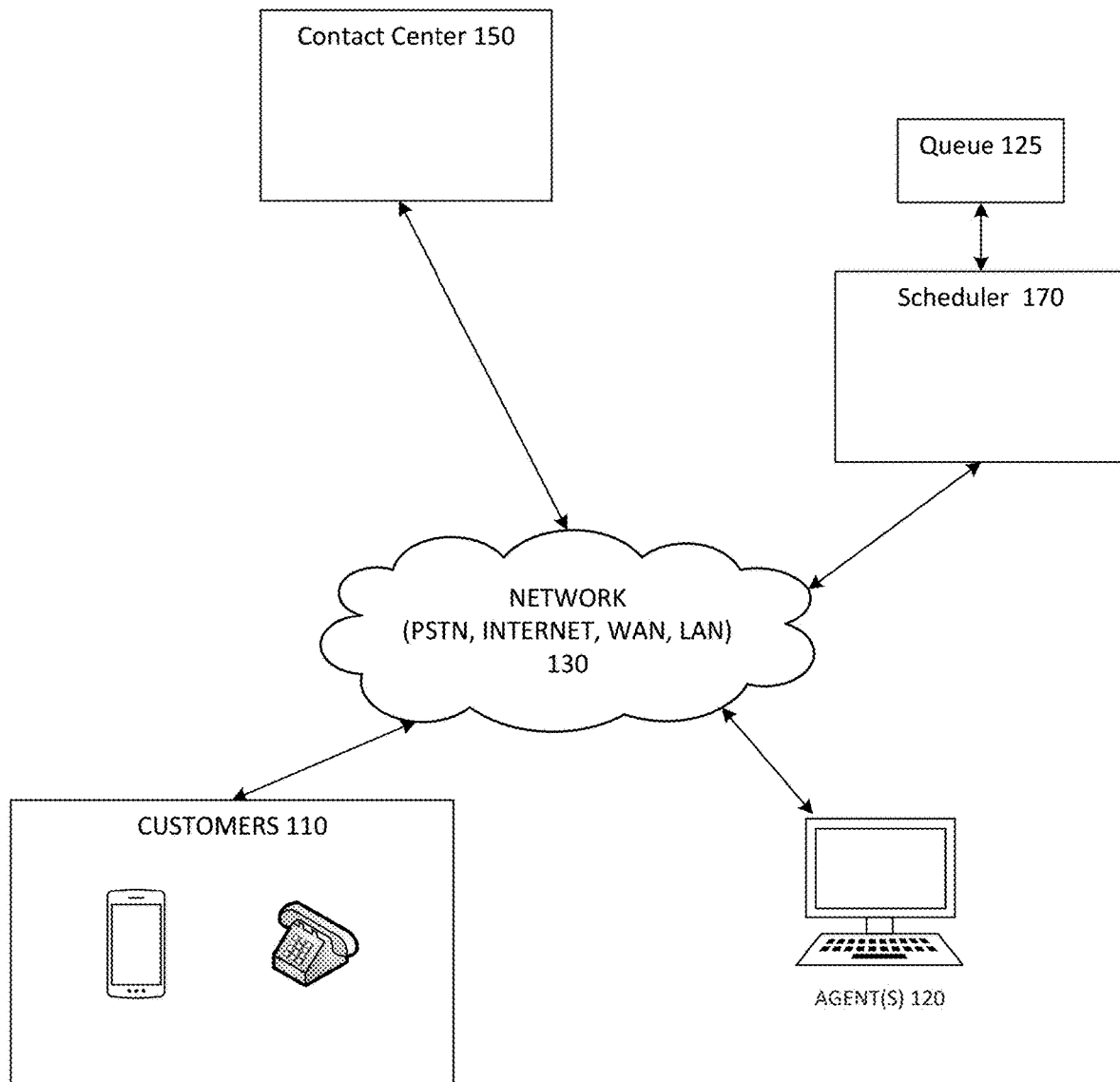
FIG. 1 is an illustration of an example system architecture.

FIG. 1 is an example system architecture 100, and illustrates example components, functional capabilities and optional modules that may be included in a cloud-based contact center infrastructure solution. Customers 110 interact with a contact center 150 using voice, email, text, and web interfaces in order to communicate with agent(s) 120 through a network 130 and one or more of text or multimedia channels. The agent(s) 120 may be remote from the contact center 150 and may handle communications with customers 110 on behalf of an enterprise. The agent(s) 120 may utilize devices, such as but not limited to, work stations, desktop computers, laptops, telephones, a mobile smartphone and/or a tablet. Similarly, customers 110 may communicate using a plurality of devices, including but not limited to, a telephone, a mobile smartphone, a tablet, a laptop, a desktop computer, or other. For example, telephone communication may traverse networks such as a public switched telephone networks (PSTN), Voice over Internet Protocol (VoIP) telephony (via the Internet), a Wide Area Network (WAN) or a Large Area Network. The network types are provided by way of example and are not intended to limit types of networks used for communications.

In some embodiments, agents 120 may be assigned to one or more queues 125, and the agents 120 assigned to a queue 125 may handle communications that are placed in the queue by the contact center 150. Agents 120 and queues 125 may each be associated with one or more skills. The skills may include language proficiency (e.g., English, Spanish, and Chinese), proficiency with certain software applications (e.g., word-processors and spreadsheets), training level (e.g., having taken a particular course or passed a particular test), seniority (e.g., number of years working as an agent 120), achievements (e.g., meeting certain performance or quality goals, receiving positive performance reviews, or receiving positive reviews or ratings from customers 120). Other types of skills may be supported.

The skills associated with an agent 120 may be the skills that the agent 120 possesses. The skills associated with a queue 125 may be the minimum set of skills that an agent 120 should posses to handle calls from the queue 125. The skills associated with a queue 125 may be set by a user or administrator.

To facilitate the assignment of agents 120 queues, the environment 100 may further include a scheduler 170. The scheduler 170 may assign agents 120 to queues 125 based on the skills associated with the agents 120, the skills associated with the queues 125, and what is referred to herein as a staffing associated with each queue. The staffing associated with a queue 125 may be the minimum number of agents 120 that are needed to work on a queue 125 to maintain a particular service level. The service level may be based on one or more metrics such the maximum amount of time that a customer 110 can be expected to wait to speak with an agent 120, for example. Other metrics may be used.

The scheduler 170 may assign agents 120 to queues 125 for one or more intervals. An interval may be the smallest amount of time that an agent 120 can be scheduled for. Intervals used by the contact center 150 may be fifteen minutes, thirty minutes, forty-five minutes etc. The particular agents 120 assigned to a queue 125 for an interval is referred to herein as an agent assignment.

The scheduler 170 may generate the staffing for a queue 125 for an interval based on a predicted workload for the queue 125 during the interval. The predicted workload may be based on historical workload data for the queue 125 and/or contact center 150 or may be provided by a user or administrator. Any method for predicting the workload of a queue 120 may be used.

The scheduler 170 may generate an agent assignment for a queue 125 for each interval based on the staffing generated for the queue 125 for the interval. For example, the call center 150 may use fifteen-minute intervals. The scheduler 170 may generate an agent assignment for the queue 125 for the 8:00 am interval based on the staffing for the interval, another agent assignment for the 8:15 am interval based on the staffing for the interval, and another assignment for the 8:30 am interval based on the staffing for the interval.

Figure 2:
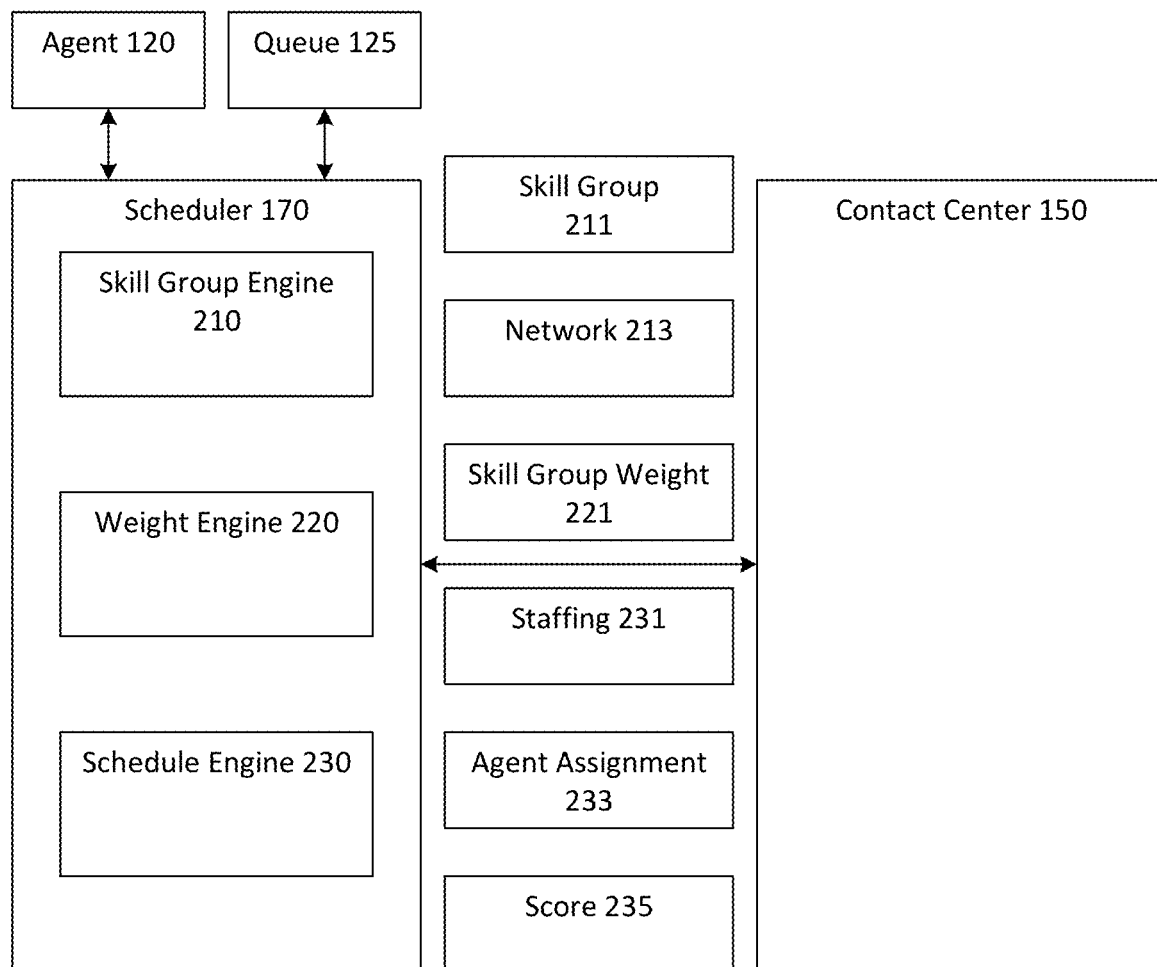
FIG. 2 is an illustration of an example system architecture for assigning agents to queues based on skill group weights within the context of the environment of FIG. 1.

FIG. 2 is an illustration of an example system architecture for incorporating a scheduler 170 into a business or entity such as a contact center 150. As shown the scheduler 170 includes various modules and components such as a skill group engine 210, a weight engine 220, and a schedule engine 230. More or fewer modules or components may be supported by scheduler 170. Depending on the embodiment, each of the skill group engine 210, weight engine 220, and the schedule engine 230 may be implemented together or separately by one or more general purpose computing devices such as the computing system 500 illustrated with respect to FIG. 5. Furthermore, while shown as separate from the scheduler 170, in some embodiments the scheduler 170 may be implemented as a component of the contact center 150.

The skill group engine 210 may divide or assign the agents 120 into skill groups 211. A skill group 211 as used herein may be a grouping of agents 120 based on the skills associated with each agent 120. In some embodiments, each agent 120 associated with a skill group 211 may be associated with the same skills. The skills associated with a skill group 211 may be the skills associated with each of the agents 120 in the skill group 211. Each agent 120 may be assigned by the skill group engine 120 into only one skill group 211. Any method for assigning agents 120 into skill groups 211 may be used.

In some embodiments, the skill group engine 210 may group agents 120 into skill groups 211 that have similar skills, rather than exactly the same skills. This type of grouping is referred to herein as a fuzzy skill group. For example, an agent 120 that is associated with the skills English and Spanish may be added to a skill group 211 associated with the skills English, Spanish, and Portuguese, even though the agent 120 does not speak Portuguese. Depending on the embodiment, the skill group engine 210 may determine to relax skills that are not popular or that are not associated with many queues 125 in the contact center 150. Continuing the example above, the skill group engine 120 may have determined that the skill Portuguese is associated with very few queues 125, and/or the queues 125 that are associated with the skill Portuguese are not very busy or have low staffing 121.

After all of the agents 120 have been assigned to a skill group 211, the skill group engine 210 may further divide the skill groups 211 into what are referred to herein as networks 213. A network 213 may be a set of skill groups 211 where each skill group 211 in the network 213 has at least one skill in common with at least one other skill group 211 in the network 213. In addition, no skill group 211 in a first network 213 has any skill in common with any skill group 211 in a second network 213.

In some embodiments, the skill group engine 210 may create a network 213 by selecting a skill group 211 for the network 213. The skill group engine 210 may determine the queue 125 that the agents 120 associated with the selected skill group 211 could work. Of the determined queues 125, the skill group engine 210 may determine the skill groups 211 whose agents 120 can work in the determined queues 125. These determined skill groups 211 may be added to the network 213. The skill group engine 210 may then continue adding skill groups 211 in this fashion until no more skill groups 211 can be added to the network 213. The skill group engine 210 may then select a skill group 211 that has not yet been added to a network 213 and may create a network 213 using the selected skill group 211 as described above.

As will be clearer later, because none of the skill groups 211 in one network have any skills in common with the skill groups 211 in another network, the weight engine 220 may perform contact center 150 simulations and may calculate skill group weights 221 for the skill groups 211 in each network 213 in parallel.

The weight engine 220 may calculate a skill group weight 221 for each skill group 211 in a network 213 for each interval. As used herein, a skill group weight 221 for a skill group 211 may be a data structure that includes a weight for each skill associated with the skill group 211 for an interval. The weight for each skill may be based on how often an agent 120 from the skill group 211 worked on a task or communication that involves the skill during the associated interval. For example, if agent 120 in a skill group 211 spent 90% of their time in an interval working on the skill Spanish and 10% of their time in the interval working on the skill English, the skill group weight 221 for the skill group 211 for the interval would be 0.90 and 0.10.

In some embodiments, the weight engine 220 may calculate the skill group weight 221 for a skill group 211, by running one or more simulations of the contact center 150. The simulation may be based on historical data for the contact center 150 and may simulate the customers 110, agents 120, and queues 125 associated with the contact center 150 for one or more intervals. Any method for simulating a contact center 150 may be used.

The weight engine 220 may determine from the simulations, how much time each agent 120 of the skill group 211 spent working using each of its skills during an interval. The determined times may be used by the weight engine 220 to determine a distribution of the agent's time across the skills during the interval. The distribution for each skill may be used as the weight for the skill for the interval.

For example, If at Sam on Monday the agent 120 spent 30% of his time on the skill English, 60% on the skill Spanish, and was idle 10% of the time (and the agent 120 is the only one in the skill group 211), the weight for the English skill during the interval Monday 8 am would be 0.333 (i.e., 30%/(30%+60%)) and the weight for the Spanish skill during the interval Monday Sam would be 0.666 (i.e., 60%/(30%+60%)). Assuming the values are the same for every interval, the skill group weights 221 for three intervals for the skill group 211 of English and Spanish would be English (0.33, 0.33, 0.33) and Spanish (0.67, 0.67, 0.67). Depending on the embodiment, the skill group weight 221 for a skill group 211 during an interval may be determined by averaging the skill group weights 221 determined for each of the agents 120 in the skill group 211 over the interval.

Note that in the event that a particular agent 120 does not do any work during a particular interval event though there was work to be done, in some embodiments, the weights of the skill group weight 221 may be assigned by the weight engine 220 proportionally based on the workload of the queues that the other agents 120 in the skill group 211 worked. Depending on the embodiment, the weights may be assigned such that the sum of the weights is always 1. Other methods for assigning the weights may be used.

The weight engine 220 may, after running each simulation of the contact center 150 for each interval, add up the number of agents 120 working on a particular skill weighted by the skill group weight 221 computed for their associated skill group 211. The computed number of agents 120 for each skill group 211 for each interval may provide a potential staffing curve for each skill that is referred to herein as "PS_SGW". Note that in some embodiments, agents 120 having only a single skill may not be considered when adding the number of agents 120 for each interval. As may be appreciated, if an agent 120 has only a single skill, then there may be no issue with determining how to divide the time of the agent 120.

Continuing the example above, in the simulation there may be two agents 120 working the skill English in a first interval, and three agents 120 working the skill English in the other two intervals. There may be one agent 120 working the skill Spanish in each of the three intervals. Assume there are four agents 120 in the skill group 211 of English and Spanish, and that the multi-skilled agents 120 were occupied 30/60/10 in intervals one and two (as discussed above), and occupied 60/20/20 in interval three (i.e., 0.75 in English, 0.25 in Spanish). Accordingly, the staffing curve PS_SGW for the three intervals would be English (1.32, 1.32, 3) and Spanish (2.68, 2.68, 1).

For real-time queues 125, the weight engine 220 may use reverse Erlang C, Erlang A, or a similar formula to compute the required staffing 231 for each skill and queue 125. Depending on the embodiment, the required staffing 231 may be the number of agents 120 needed to work a queue 125 in order to meet a desired service level. The service level may be provided by one or more of the simulations ran by the weight engine 220.

The Erlang formulas take inputs like interaction volume, average handling time, and staffing 231 and output a predicted service level. As may be appreciated, the weight engine 220 may reverse an Erlang formula to predict the staffing 231 required for the service level. For example, the weight engine 220 may use the service level provided by the simulation (along with the interaction volume and average handling time if available) and an Erlang formula to predict the staffing 231. The predicted staffing 231 for each interval may form a curve that is referred to herein as "PS_Erlang". In order to account for single skilled agents 120, the weight engine 220 can remove these from PS_Erlang to generate a new Erlang staffing curve for just the multi-skilled agents 120. This curve is referred to herein as "PS_MSE".

The weight engine 220 may calculate the final skill group weights 221 for each skill group 211 by, for each skill group 211, adjusting each weight in the skill group weight 221 up by a percentage difference between the curves PS_SGW and PS_MSE for each interval for that skill. Continuing the example above, if PS_MSE was 20% higher than PS_SGW for the English skill in interval one, the final weight for English for the skill group 211 of English and Spanish in that interval would be 36% (i.e., 30%*1.2). Because this process is used to model the increasing effect of having a multi-skilled agent that can work on other queues 125 when one is idle, this process may be skipped for non-real-time queues 125.

As a final example, the curve PS_Erlang may have the following weights for the skills English and Spanish of a skill group 221 for the intervals one, two, and three: PS_Erlang: English (3.5, 6, 5.5) and Spanish (3, 2, 3). The weight engine 220 may subtract the effect of the single skill agents 120 to get PS_MSE: English (1.5, 3, 2.5) and Spanish (2, 1, 2).

From the example above, the value of PS_SGW for the intervals was PS_SGW: English (1.32, 1.32, 3) & Spanish (2.68, 2.68, 1), and the value of the skill group weight 221 for the intervals for the skill group 211 of English and Spanish was English (0.33, 0.33, 0.75) & Spanish (0.67, 0.67, 0.25).

The weight engine 220 may calculate the percent difference between PS_MSE and PS_SGW for each skill of the skill group weight 221 at each interval to get: English (1.13, 2.27, 0.83) and Spanish (0.75, 0.75, 2). Finally, the weight engine 220 may multiply the skill group weights 221 for the intervals by the differences to get the final skill group weights 221 for the intervals of: English (0.37, 0.75, 0.75) and Spanish (0.67, 0.67, 0.5).

In some embodiments, when the weight engine 220 attempts to calculate a skill group weight 221 for a skill group 211 for a certain interval, during the simulation no agents 120 (or few agents 120) may have done any work with respect to some or all of the skills associated with the skill group 211 for that interval. Because no (or little) work was performed, it may be difficult for the weight engine 220 to determine the appropriate skill group weights 221 for the interval.

Depending on the embodiment, the weight engine 220 may solve this problem in various ways. One solution is to find another interval having similar characteristics as the current interval. For example, the weight engine 220 may find an interval with a similar interaction volume or average handling time. The weight engine 220 may use the calculated skill group weight 221 for the skill group 211 for the similar interval for the current interval.

Another solution is to use a skill group weight 221 calculated for a similar skill group 211 for the same interval. For example, the weight engine 220 may select a skill group 211 with the most skills in common with the current skill group 211 and may determine the skill group weight 221 for the current skill group 221 based on the skill group weight 221 of the common skill group 211.

As another solution, the weight engine 220 may use the skill group weight 221 calculated for the current interval for a different simulation of the contact center 150 in the current set of simulations. Further, if so suitable skill group weight 221 is found in the current simulations for the current interval, the weight engine 220 may consider skill group weights 221 calculated for the same interval in past sets of simulations.

The weight engine 220 may attempt to find a suitable skill group weight 221 for the current interval using the methods described above. If no such skill group weight can be determined using any of the described methods, the weight engine 220 may use combinations of the above methods.

The skill group weights 221 may be calculated by the weight engine 220 periodically, and preferably before the skill group weights 221 are needed to place agents 120. As may be appreciated, simulating one or more queues 125 of a contact center 150 based on schedules and forecasts can be a very time consuming and resource intensive operation. Accordingly, the simulations may run periodically to generate the skill group weights 211, and the skill groups weights 211 may be later used when needed to place agents 120. This in an improvement over prior art systems that run simulations each time an agent 120 placement is needed, which is inefficient and results in delayed agent 120 placement.

The schedule engine 230 may use the calculated skill group weights 221 for each queue 125 for each interval to determine which queue 120 to place an agent 120 based on the skills associated with the agent 120. Depending on the embodiment, the schedule engine 230 may receive a request to generate an agent assignment 233 for a set of queues 125 for one or more intervals. The agent assignment 233 may be an assignment of one or more agents 120 to the queues 125 of the contact center 150 for the one or more intervals.

As one example, the schedule engine 230 may receive a request for an agent assignment 233 of a plurality of agents 120 to a plurality of queues 125 for an interval. For each of some number of iterations, the schedule engine 230 may place the agents 120 into the queues 125 based on the skills required by each queue 125 and the skills associated with each agent 120 according to the required staffing of each queue 125 to generate an agent assignment 233.

After generating the assignment 233, the schedule engine 230 may calculate a score 235 for each of the queues 125 for the iteration. The score 235 for a queue 125 may be calculated based on the staffing 231 associated with the queue 125 and the skill group weights 221 associated with skill groups 211 of the agents 120 assigned to the queue 120. Depending on the embodiment, the scores 235 may be calculated using a delta squared objective function. However, other functions may be used.

Generally, the schedule engine 230 may calculate a score 235 for a queue 125 for one or more intervals by, for each interval, taking the required staffing 231 for the interval minus the product of the number of agents 120 assigned to the queue 120 for the interval and the weight of the skill group weight 211 for the skill group 211 associated with the agents 120. The sum over each interval for the queue 125 may be the score for the queue 120.

For example, continuing the example from above. Assume a skill group weight 221 for the skill group 211 of English and Spanish for three intervals is English (0.37, 0.75, 0.75) and Spanish (0.67, 0.67. and 0.5). The schedule engine 230 may be calculating the score 235 for the placement of agents 120 from the skill group 211. There may be five agents 120 from the skill group 211 English and Spanish that may be placed in a queue 125 that has the required staffing 231 of one agent 120 with the skill English and two agents 120 with the skill Spanish for the first interval, five agents 120 with the skill English and one agent 120 with the skill Spanish for the second interval, and three agents 120 with the skill English and zero agents 120 with the skill Spanish for the third interval.

Already part of the agent assignment 233 for the three intervals may be agents 120 from the skill group 211 Spanish and agents from the skill group 211 English (i.e., single skill groups). In particular, there may be two agents 120 from the skill group 211 English and one agent 120 from the skill group 211 Spanish assign to work the first interval, there may be three agents 120 from the skill group 211 English and one agent 120 from the skill group 211 Spanish assign to work the second interval, and there may be three agents 120 from the skill group 211 English and one agent 120 from the skill group 211 Spanish assign to work the third interval.

The schedule engine 230 may calculate the score 235 for assigning the five agents 120 from the skill group 211 English and Spanish to the queue 125 using a delta squared objective function. In particular, the schedule engine 230 may calculate for each queue 125, and for each interval, the sum of the required agents 120 for each interval minus the number of agents 120 working times their skill group weight 221 for that skill.

Thus, the score 235 for the queue 125 for the skill English would be:

$(1-(2+(5*0.37)))^2+(5-(3+(5*0.75)))^2+(3-(3+(5*0.75)))^2=25$

Similarly, the score 235 for the queue 125 for the skill Spanish would be:

$(2-(1+(5*0.67)))^2+(1-(1+(5*0.67)))^2+(0-(1+(5*0.5)))^2=29$

Accordingly, the total score 235 for the placement of the five agents 120 from the skill group 211 English and Spanish in the queue 125 for the three intervals would be 54.

After each of the iterations are completed, the schedule engine 230 may select the assignment 233 that received the overall best scores 235. Generally, the lower the score 235 the better the agent assignment 233 with respect to the associated queue 125. Accordingly, the schedule engine 230 may select the assignment that received the lowest total score across all of the queues 125.

Figure 3:
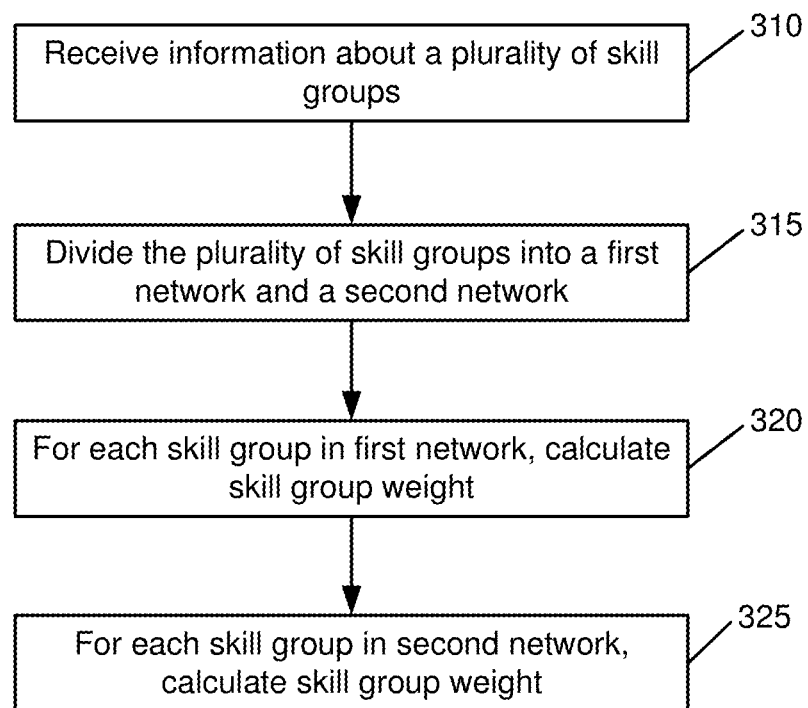
FIG. 3 is an illustration of an example method for dividing skill groups into a plurality of networks, and for calculating skill group weights for the skill groups in each network in parallel.

FIG. 3 is an illustration of an example method 400 for dividing skill groups into a plurality of networks, and for calculating skill group weights for the skill groups in each network in parallel. The method 300 may be implemented by the scheduler 170.

At 310, information about a plurality of skill groups is received. The information may be received by the skill group engine 210 of the scheduler 170. Each skill group 211 may include one or more agents 120. In some embodiments, the information may associate each skill group 211 with one or more skills. Each agent 120 may have some or all of the skills associated with its skill group 211.

At 315, the plurality of skill groups is divided into a first network and a second network. The plurality of skill groups 211 may be divided by the skill group engine 210. Each network 213 may include skill groups 211 that have no associated skills in common with any skill groups 211 in any other network 213. While only a first network 213 and a second network 213 are described, it is for illustrative purposes only; there is no limit to the number of networks 213 that may be supported.

At 320, for each skill group in the first network, a skill group weight is calculated. The skill group weights 211 may be calculated by the weight engine 220 for the same one or more intervals. As described above, the skill group weight 221 for a skill group 211 at an interval may be calculated by running simulations of the contact center 150 for the agents 120 in the skill group 211.

At 325, for each skill group in the second network, a skill group weight is calculated. The skill group weights 221 may be calculated by the weight engine 220 for the same one or more intervals. Because the first network 213 and the second network 213 have no skill groups 211 in common, the skill group weights 221 for the second network 213 may be calculated substantially in parallel with the skill group weights 221 for the first network 213.

Figure 4:
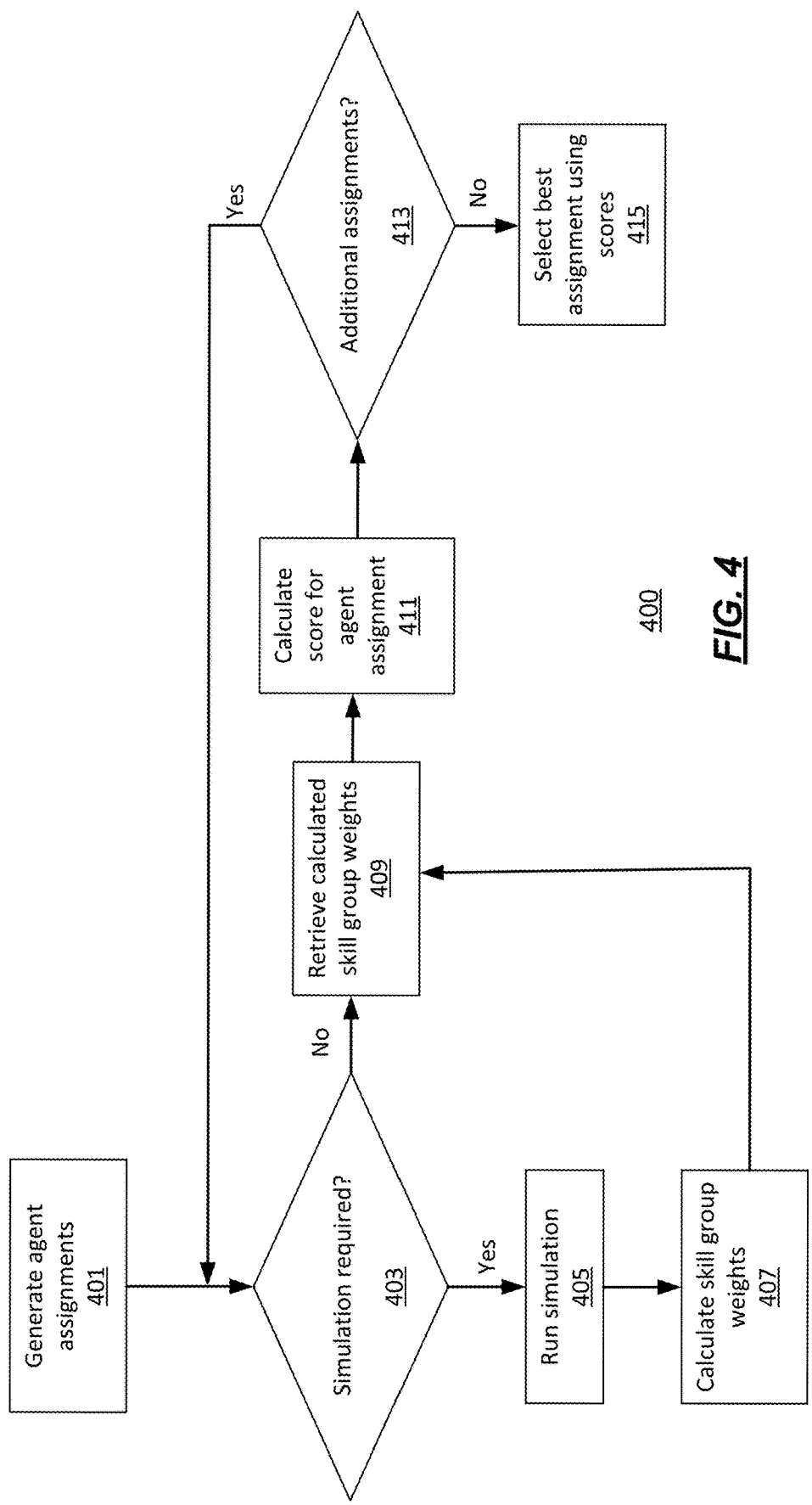
FIG. 4 is an illustration of an example method for generating an agent assignment based on skill group weights.

FIG. 4 is an illustration of an example method 400 for generating and implementing an agent assignment 233 based on skill group weights 221. The method 400 may be implemented by the scheduler 170.

At 401, a plurality of agent assignments is generated. The agent assignments 233 may be generated by the schedule engine 230 of the scheduler 170 for an interval by assigning agents 120 to queues 125 based on the skills associated with each agent 120 and the required staffing 231 needed to meet a desired service level for the interval. Any method for generating agent assignments 233 may be used.

At 403, a determination is made as to whether a simulation is required. The determination may be made by the weight engine 220. Depending on the embodiment, the simulation of the contact center 150 and/or the queues 125 may be required when the interval has not yet been simulated by the weight engine 220, or a threshold amount of time has passed since a last simulation. If a simulation is required, the method 400 may continue at 405. Else, the method may continue at 409.

At 405, a simulation is ran. The contact center 150 may be simulated by the weight engine 220 for an interval. The contact center 150 may be simulated for the interval based on historical data about how busy the various agents 120 and queues 125 were handling communications for customers 110 of the contact center 150 for the same or similar intervals. Other information about the contact center 150 such as the IVO and AHT associated with the agents 120 may be used for the simulation. Depending on the embodiment, the contact center 150 may be simulated multiple times for the interval. Any method for simulating a contact center 150 may be used.

At 407, skill group weights are calculated. The skill group weight 221 for each skill group 211 associated with an agent 120 may be calculated by the weight engine 220 using the results of the simulations. In some embodiments, the weight engine 220 may calculate the skill group weight 221 for a skill group 211 by determining the amount of time that each agent 120 associated with the skill group 211 spent working on each associated skill. The determined amount of time for each skill may be used to determine the skill group weight 221. After calculating the skill group weights 221 for each skill group 211 for the interval, the skill group weights 221 may be stored for later use.

At 409, calculated skill group weights are retrieved. The calculated skill group weights 221 for the interval may be retrieved by the weight engine 220.

At 411, a score is calculated for the agent assignment. The score 235 for the agent assignment 233 may be calculated by the schedule engine 230. The score 235 may be calculated for the agent assignment 233 for the interval based on the skill group weights 221 associated with each skill group 211, the agents 120 assigned to each queue 120, and the required staffing 231 of the queues 125 for the interval. Depending on the embodiment, the scores 235 may be calculated using a delta squared objective function.

At 413, a determination is made as to whether there are additional assignments to score. If there are additional assignments 233 to score, the method 400 may return to 403. Else, the method 400 may continue to 415.

At 415, the best assignment is selected based on the scores. The best agent assignment 233 may be selected by the schedule engine 230 of the scheduler 170. Depending on the embodiment, the agent assignment 233 with the lowest (or highest) associated score 235 may be the best assignment 233. The selected assignment 233 may be implemented by the contact center 150 for the interval.

Figure 5:
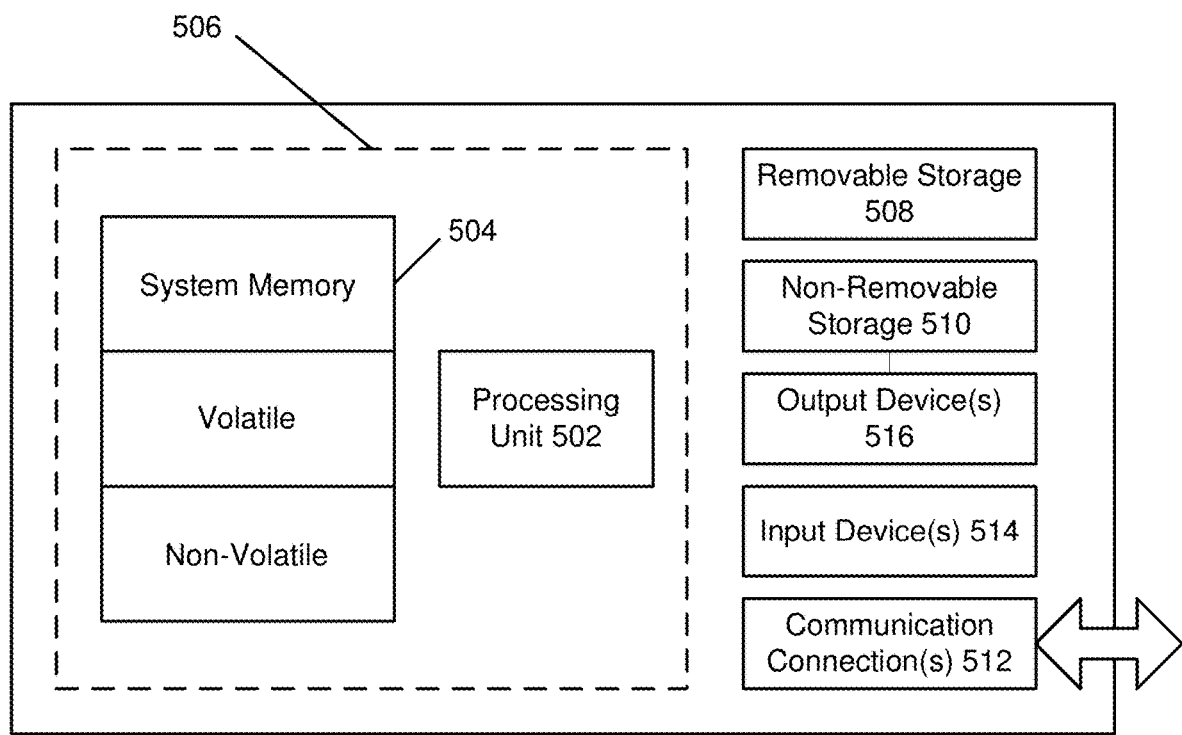
FIG. 5 illustrates an example computing device.

FIG. 5 shows an exemplary computing environment in which example embodiments and aspects may be implemented. The computing system environment is only one example of a suitable computing environment and is not intended to suggest any limitation as to the scope of use or functionality.

Numerous other general purpose or special purpose computing system environments or configurations may be used. Examples of well-known computing systems, environments, and/or configurations that may be suitable for use include, but are not limited to, personal computers, servers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 5, an exemplary system for implementing aspects described herein includes a computing device, such as computing device 500. In its most basic configuration, computing device 500 typically includes at least one processing unit 502 and memory 504. Depending on the exact configuration and type of computing device, memory 504 may be volatile (such as random access memory (RAM)), non-volatile (such as read-only memory (ROM), flash memory, etc.), or some combination of the two. This most basic configuration is illustrated in FIG. 5 by dashed line 506.

Computing device 500 may have additional features/functionality. For example, computing device 500 may include additional storage (removable and/or non-removable) including, but not limited to, magnetic or optical disks or tape. Such additional storage is illustrated in FIG. 5 by removable storage 508 and non-removable storage 510.

Computing device 500 typically includes a variety of tangible computer readable media. Computer readable media can be any available tangible media that can be accessed by device 500 and includes both volatile and non-volatile media, removable and non-removable media.

Tangible computer storage media include volatile and non-volatile, and removable and non-removable media implemented in any method or technology for storage of information such as computer readable instructions, data structures, program modules or other data. Memory 504, removable storage 508, and non-removable storage 510 are all examples of computer storage media. Tangible computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 500. Any such computer storage media may be part of computing device 500.

Computing device 500 may contain communications connection(s) 512 that allow the device to communicate with other devices. Computing device 500 may also have input device(s) 514 such as a keyboard, mouse, pen, voice input device, touch input device, etc. Output device(s) 516 such as a display, speakers, printer, etc. may also be included. All these devices are well known in the art and need not be discussed at length here.

Returning to FIG. 1, agent(s) 120 and customers 110 may communicate with each other and with other services over the network 130. For example, a customer calling on telephone handset may connect through the PSTN and terminate on a private branch exchange (PBX). A video call originating from a tablet may connect through the network 130 terminate on the media server. A smartphone may connect via the WAN and terminate on an interactive voice response (IVR)/intelligent virtual agent (IVA) components. IVR are self-service voice tools that automate the handling of incoming and outgoing calls. Advanced IVRs use speech recognition technology to enable customers to interact with them by speaking instead of pushing buttons on their phones. IVR applications may be used to collect data, schedule callbacks and transfer calls to live agents. IVA systems are more advanced and utilize artificial intelligence (AI), machine learning (ML), advanced speech technologies (e.g., natural language understanding (NLU)/natural language processing (NLP)/natural language generation (NLG)) to simulate live and unstructured cognitive conversations for voice, text and digital interactions. In yet another example, Social media, email, SMS/MMS, IM may communicate with their counterpart's application (not shown) within the contact center 150.

The contact center 150 itself be in a single location or may be cloud-based and distributed over a plurality of locations. The contact center 150 may include servers, databases, and other components. In particular, the contact center 150 may include, but is not limited to, a routing server, a SIP server, an outbound server, a reporting/dashboard server, automated call distribution (ACD), a computer telephony integration server (CTI), an email server, an IM server, a social server, a SMS server, and one or more databases for routing, historical information and campaigns.

The ACD is used by inbound, outbound and blended contact centers to manage the flow of interactions by routing and queuing them to the most appropriate agent. Within the CTI, software connects the ACD to a servicing application (e.g., customer service, CRM, sales, collections, etc.), and looks up or records information about the caller. CTI may display a customer's account information on the agent desktop when an interaction is delivered. Campaign management may be performed by an application to design, schedule, execute and manage outbound campaigns. Campaign management systems are also used to analyze campaign effectiveness.

For inbound SIP messages, the routing server may use statistical data from reporting/dashboard information and a routing database to the route SIP request message. A response may be sent to the media server directing it to route the interaction to a target agent 120. The routing database may include: customer relationship management (CRM) data; data pertaining to one or more social networks (including, but not limited to network graphs capturing social relationships within relevant social networks, or media updates made by members of relevant social networks); agent skills data; data extracted from third party data sources including cloud-based data sources such as CRM; or any other data that may be useful in making routing decisions.

The integration of real-time and non-real-time communication services may be performed by unified communications (UC)/presence sever. Real-time communication services include Internet Protocol (IP) telephony, call control, instant messaging (IM)/chat, presence information, real-time video and data sharing. Non-real-time applications include voicemail, email, SMS and fax services. The communications services are delivered over a variety of communications devices, including IP phones, personal computers (PCs), smartphones and tablets. Presence provides real-time status information about the availability of each person in the network, as well as their preferred method of communication (e.g., phone, email, chat and video).

Recording applications may be used to capture and play back audio and screen interactions between customers and agents. Recording systems should capture everything that happens during interactions and what agents do on their desktops. Surveying tools may provide the ability to create and deploy post-interaction customer feedback surveys in voice and digital channels. Typically, the IVR/IVA development environment is leveraged for survey development and deployment rules. Reporting/dashboards are tools used to track and manage the performance of agents, teams, departments, systems and processes within the contact center. Reports are presented in narrative, graphical or tabular formats. Reports can be created on a historical or real-time basis, depending on the data collected by the contact center applications. Dashboards typically include widgets, gadgets, gauges, meters, switches, charts and graphs that allow role-based monitoring of agent, queue and contact center performance. Unified messaging (UM) applications include various messaging and communications media (voicemail, email, SMS, fax, video, etc.) stored in a common repository and accessed by users via multiple devices through a single unified interface.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving information about a plurality of agents, wherein each agent is associated with one or more skills of a plurality of skills, wherein each agent is associated with a skill group of a plurality of skill groups, and further wherein each skill group is associated with a skill group weight for a time interval;
   receiving a required staffing for each queue of a plurality of queues for the time interval, wherein each queue is associated with at least one skill from among the plurality of skills; and
   assigning agents of the plurality of agents to each queue for the time interval based on the required staffing for each queue and the skill group weight associated with the skill group associated with each agent of the plurality of agents by:
   for each iteration of a plurality of iterations:
   generating an agent assignment for the iteration by:
   for each queue of the plurality of queues:
   assigning agents of the plurality of agents to the queue based on the one or more skills associated with the queue, the one or more skills associated with the agents, and the required staffing for the queue; and calculating a score for the agent assignment based on the required staffing for each queue and the skill group weights of the skill groups associated with the agents assigned to each queue.

2. The method of claim 1, further comprising implementing the agent assignment associated with a lowest calculated score.

3. The method of claim 1, wherein the scores are calculated using a delta squared objective function.

4. The method of claim 1, further comprising calculating the skill group weight associated with at least one skill group of the plurality of skill groups for the time interval.

5. The method of claim 4, wherein calculating the skill group weight for the at least one skill group of the plurality of skill groups for the time interval comprises simulating a contact center for the time interval using the agents associated with the at least one skill group and calculating the skill group weight based on the simulation.

6. The method of claim 5, wherein simulating the contact center comprises simulating the contact center using historical contact center data.

7. The method of claim 1, wherein at least one skill group comprises a fuzzy skill group.

8. A system comprising:
at least one processor; and
a non-transitory computer readable medium comprising instructions that, when executed by the at least one processor, cause the system to:
   receive information about a plurality of agents, wherein each agent is associated with one or more skills of a plurality of skills, wherein each agent is associated with a skill group of a plurality of skill groups, and further wherein each skill group is associated with a skill group weight for a time interval;
   receive a required staffing for each queue of a plurality of queues for the time interval, wherein each queue is associated with at least one skill from among the plurality of skills; and
   assign agents of the plurality of agents to each queue for the time interval based on the required staffing for each queue and the skill group weight associated with the skill group associated with each agent of the plurality of agents by:
   for each iteration of a plurality of iterations:
      generating an agent assignment for the iteration by:
         for each queue of the plurality of queues:
            assigning agents of the plurality of agents to the queue based on the one or more skills associated with the queue, the one or more skills associated with the agents, and the required staffing for the queue; and
            calculating a score for the agent assignment based on the required staffing for each queue and the skill group weights of the skill groups associated with the agents assigned to each queue.

9. The system of claim 8, further comprising implementing the agent assignment associated with a lowest calculated score.

10. The system of claim 8, wherein the scores are calculated using a delta squared objective function.

11. The system of claim 8, further comprising calculating the skill group weight associated with at least one skill group of the plurality of skill groups for the time interval.

12. The system of claim 11, wherein calculating the skill group weight for the at least one skill group of the plurality of skill groups for the time interval comprises simulating a contact center for the time interval using the agents associated with the at least one skill group and calculating the skill group weight based on the simulation.

13. The system of claim 12, wherein simulating the contact center comprises simulating the contact center using historical contact center data.

14. The system of claim 8, wherein at least one skill group comprises a fuzzy skill group.

15. A non-transitory computer readable medium comprising instructions that, when executed by at least one processor, cause a computer system to:
   receive information about a plurality of agents, wherein each agent is associated with one or more skills of a plurality of skills, wherein each agent is associated with a skill group of a plurality of skill groups, and further wherein each skill group is associated with a skill group weight for a time interval;
   receive a required staffing for each queue of a plurality of queues for the time interval, wherein each queue is associated with at least one skill from among the plurality of skills; and
   assign agents of the plurality of agents to each queue for the time interval based on the required staffing for each queue and the skill group weight associated with the skill group associated with each agent of the plurality of agents by:
   for each iteration of a plurality of iterations:
      generating an agent assignment for the iteration by:
         for each queue of the plurality of queues:
            assigning agents of the plurality of agents to the queue based on the one or more skills associated with the queue, the one or more skills associated with the agents, and the required staffing for the queue; and
            calculating a score for the agent assignment based on the required staffing for each queue and the skill group weights of the skill groups associated with the agents assigned to each queue.

16. The computer readable medium of claim 15, further comprising implementing the agent assignment associated with a lowest calculated score.

17. The computer readable medium of claim 15, wherein the scores are calculated using a delta squared objective function.

18. The computer readable medium of claim 15, further comprising calculating the skill group weight associated with at least one skill group of the plurality of skill groups for the time interval.

19. The computer readable medium of claim 18, wherein calculating the skill group weight for the at least one skill group of the plurality of skill groups for the time interval comprises simulating a contact center for the time interval using the agents associated with the at least one skill group and calculating the skill group weight based on the simulation.

20. The computer readable medium of claim 19, wherein simulating the contact center comprises simulating the contact center using historical contact center data.

* * * * *